United States Patent
Uzoh et al.

(10) Patent No.: US 6,413,854 B1
(45) Date of Patent: Jul. 2, 2002

(54) METHOD TO BUILD MULTI LEVEL STRUCTURE

(75) Inventors: Cyprian E. Uzoh, Milpitas, CA (US); Daniel C. Edelstein, New Rochelle, NY (US); Cheryl Faltermeier, LaGrange, NY (US); Peter S. Locke, Hopewell Junction, NY (US)

(73) Assignee: International Business Machines Corp., Armonk, NY (US)

( * ) Notice: Subject to any disclaimer, the term of this patent is extended or adjusted under 35 U.S.C. 154(b) by 0 days.

(21) Appl. No.: 09/382,110

(22) Filed: Aug. 24, 1999

(51) Int. Cl.⁷ .......................................... H01L 21/4763
(52) U.S. Cl. ...................... 438/637; 438/619; 438/622; 438/629
(58) Field of Search ................ 438/637, 619, 438/622, 624, 625, 626, 629

(56) References Cited

U.S. PATENT DOCUMENTS

| | | | |
|---|---|---|---|
| 3,791,858 A | * 2/1974 | McPherson et al. ........ 117/201 |
| 4,519,872 A | 5/1985 | Anderson, Jr. et al. |
| 4,539,222 A | 9/1985 | Anderson, Jr. et al. |
| 4,899,439 A | * 2/1990 | Potter et al. .................. 29/846 |
| 4,996,584 A | 2/1991 | Young et al. |
| 5,000,818 A | * 3/1991 | Thomas et al. ............. 156/643 |
| 5,219,787 A | 6/1993 | Carey et al. |
| 5,354,712 A | 10/1994 | Ho et al. |
| 5,391,921 A | * 2/1995 | Kudoh et al. ................ 257/758 |
| 5,453,642 A | 9/1995 | Kaja et al. |
| 5,494,858 A | 2/1996 | Gnade et al. |
| 5,527,737 A | 6/1996 | Jeng |
| 5,548,159 A | 8/1996 | Jeng |
| 5,550,405 A | 8/1996 | Cheung et al. |
| 5,585,673 A | 12/1996 | Joshi et al. |
| 5,675,187 A | * 10/1997 | Numata et al. ............. 257/758 |
| 5,716,890 A | 2/1998 | Yao |
| 5,755,859 A | 5/1998 | Brusic et al. |
| 5,793,272 A | 8/1998 | Burghartz et al. |
| 5,807,165 A | 9/1998 | Uzoh et al. |
| 6,008,108 A | * 12/1999 | Huang et al. ................ 438/436 |
| 6,037,248 A | * 3/2000 | Ahn ............................ 438/622 |
| 6,146,986 A | * 11/2000 | Wagganer .................... 438/622 |

* cited by examiner

*Primary Examiner*—Michael Trinh
(74) *Attorney, Agent, or Firm*—Connolly Bove Lodge & Hutz, LLP; Joseph P. Abate, Esq.

(57) ABSTRACT

A method for forming a structure. A first dielectric material is deposited on a substrate. The first dielectric material is patterned. At least one metal is deposited in and on the first dielectric material. Portions of the at least one metal are removed at least in a region above an upper surface of the first dielectric material. The first dielectric material is removed. A second dielectric material is provided in place of first dielectric material.

35 Claims, 6 Drawing Sheets

METHOD TO BUILD MULTI LEVEL STRUCTURE

FIELD OF THE INVENTION

The invention relates to semiconductor devices. In particular, the invention relates to a multi-level metal structure and a process for forming the multi-level metal structure.

BACKGROUND OF THE INVENTION

Metallic structures are formed in semiconductor devices for carrying out a plurality of functions including transmission of current and signals between and among various layers in multi-layer semiconductor device structures. Metal structures may also be included in a semiconductor device structure for heat transmission. The metal structures may include one or more metals and/or alloys. Typically, the metal structures are surrounded in the semiconductor devices by dielectric material to isolate and support them.

SUMMARY OF THE INVENTION

The present invention provides a method for forming a metal structure. The method includes depositing a first dielectric material on a substrate. The first dielectric material is patterned. At least one metal is deposited in and on the patterned first dielectric material. Portions of the at least one metal are removed in a region above an upper surface of the patterned first dielectric material. The first dielectric material is removed. A second dielectric material is provided in place of the first dielectric material.

The present invention also provides a metal structure formed according to a method including depositing a first dielectric material on a substrate and patterning the first dielectric material. At least one metal is deposited in and on the patterned first dielectric material. Portions of the at least one metal are removed at least in a region above an upper surface of the patterned first dielectric material. The first dielectric material is removed and a second dielectric material is provided in place of the first dielectric material.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BRIEF DESCRIPTION OF THE DRAWINGS

The above-mentioned objects and advantages of the present invention will be more clearly understood when considered in conjunction with the accompanying drawings, in which.

DETAILED DESCRIPTION OF THE INVENTION

As stated above, metal structures are formed in semiconductor devices to carry out a plurality of functions. Metal structures typically are surrounded by dielectric material to isolate and support them. In a damascene structure, the metal(s) are deposited directly in the dielectric material.

Often metallic structures are made in a plurality of layers. Often times, the metallic structures may be stacked on top of each other. In a damascene structure, forming the metal structures, whether multi-layer or not can result in problems with the dielectric material. For example, some dielectric materials exhibit poor resistance to crack propagation, particularly when the dielectric materials are in tension. Some dielectric materials may additionally or alternatively suffer from moisture stress corrosion.

The above-discussed problems are particularly associated with spin-on dielectric materials. Many spin-on dielectrics are fragile particularly when compared to traditional oxides. However, spin-on dielectric materials are very attractive materials for application in multi-level interconnections especially because of their cost and ease of use. These properties make these dielectric materials difficult to utilize and damascene chip wiring methods. However, damascene chip wiring methods are especially useful, particularly for forming copper wiring structures, which are especially desirable.

Many dielectric materials, whether spin-on or not, may also exhibit poor adhesion. Such dielectrics may be very tough to integrate and build into a structure. Additionally, such materials can experience local and/or global delamination. Furthermore, some dielectric materials may have poor fracture strength. Poor fracture strength can lead to tensile cracks, intralevel and interlevel shorts, and yield loss.

Some dielectric materials are also sensitive to reactive ion etch processes. Along these lines, the dielectric materials may undergo structural material changes. Reactive ion etching can also cause the dielectric constant to change. Furthermore, reactive ion etching processes can cause cracking in dielectric materials as well as change in other characteristics, such as hydrophilicity, among other characteristics.

Figure 1:
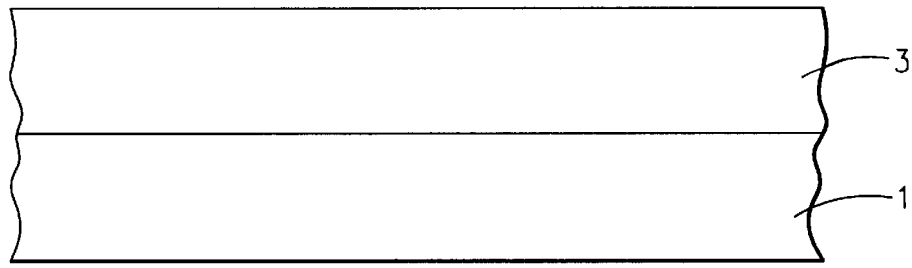
FIG. 1, FIG. 2, FIG. 3, and FIG. 4 represent cross-sectional views of a structure at various stages of being formed according to a typical damascene process.

FIGS. 1–4 illustrate cross-sectional views of a structure at various stages according to a typical known damascene process. Along these lines, FIG. 1 illustrates a substrate 1 on which a layer of an insulator 3 has been deposited. The insulating layer 3 may be patterned utilizing typical photolithography and etching techniques to form a pattern of openings 5 in the insulator layer 3. For example, reactive ion etching could be utilized to form the pattern of openings 5 in the insulating layer 3.

Figure 2:
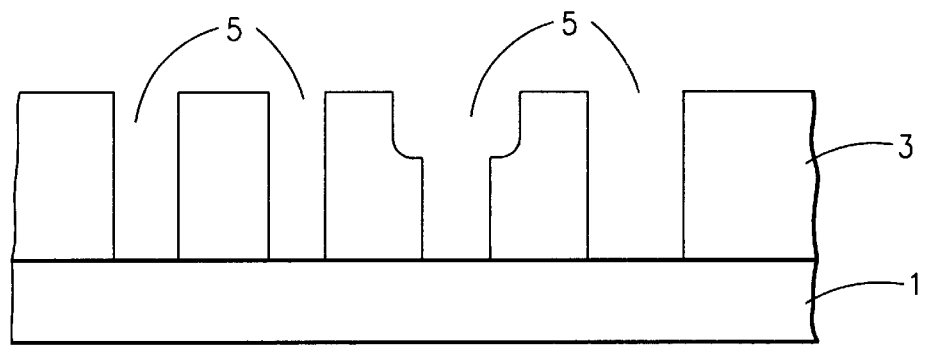
Figure 3:
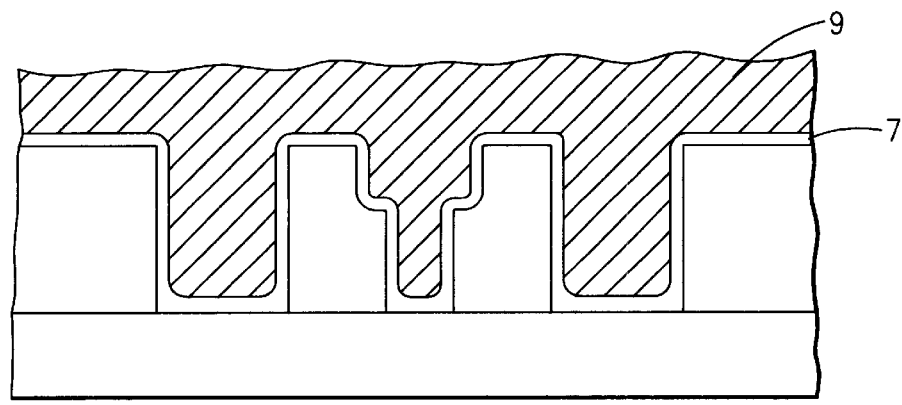
Figure 4:
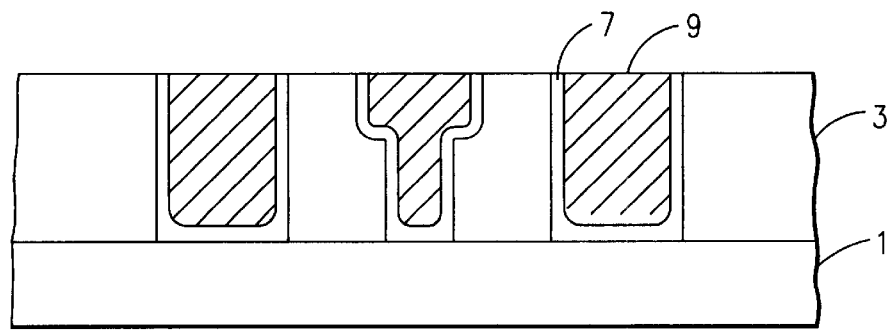

FIG. 2 illustrates an example of a patterned insulating layer 3. An adhesion layer 7 may be deposited over insulator layer 3 and expose substrate 1 in the openings 5 in the insulator layer. Metal 9 may then be deposited in the openings 5 and over the upper surface of the insulator layer 3. After depositing the metal 9, portions of the metal may be removed through polishing. The polishing may also remove portions of the adhesive layer/barrier layer 7 lying on top of the upper surface of insulator layer 3. FIG. 4 illustrates the resulting structure.

The present invention provides a solution to the above described and other problems by providing a method for fabricating multi-level metal structures in semiconductor devices utilizing brittle and non brittle spin-on films. According to the present invention, after forming a structure such as that illustrated in FIG. 4, the insulator material 3 may be removed. A second insulating material may be provided in place of the first insulating, or dielectric, material. In view of its removal, the first dielectric material may be referred to as a sacrificial dielectric, or insulator, material.

Among the advantages of the present invention are eliminating exposure of the second dielectric to reactive ion etches which can cause structural material changes. The present invention also provides a minimum risk method to build metal structures and utilize less mechanically durable insulators with desirable dielectric constants. This is particularly important because the present invention eliminates problems associated with chemical mechanical polishing or other polishing techniques on top of soft insulators.

Figure 5:
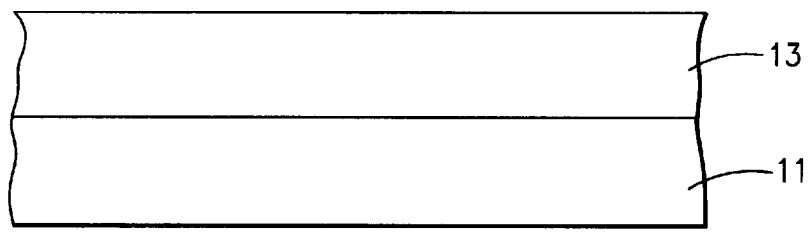
FIG. 5, FIG. 6, FIG. 7, FIG. 8, and FIG. 9 represent cross-sectional views of an embodiment of a structure at various stages of an embodiment of a process according to the present invention.
Figure 6:
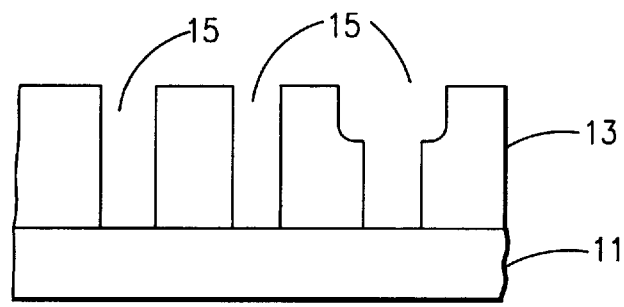

FIGS. 5–9 illustrate a structure at various stages according to an embodiment of a process according to the present invention. As can be seen from FIGS. 5–9, a process according to the present invention may produce a similar looking structure at certain points in relation to the appearance of the structure formed according to a traditional damascene process. Along these lines, FIG. 5 illustrates a substrate 11 on which a layer of dielectric material 13 has been deposited.

Any dielectric material may be utilized as the first dielectric. According to one embodiment, the first dielectric material is a polymeric material. The polymeric material may include soluble epoxies. However, while the present invention may be utilized with any dielectric materials, it is particularly useful with spin-on dielectric materials. Examples of spin-on dielectrics include hydrogen or methyl-silsesquioxanes, such as flowable oxide (FOX) and 650-F; poly-arylene ethers, such as SilK and FLARE; porous silicate glasses, such as nanoglass and xerogel; polyimides; fluoropolymers; epoxies; and spin-on glasses.

Dielectric layer 13 may be patterned to form a pattern of openings 15 in the dielectric layer 13. The pattern of openings 15 may be formed in the dielectric layer according to traditional photolithography and etching techniques. After patterning the dielectric layer 13, the dielectric material may be stabilized. According to the present invention, stabilization of the dielectric material can include exposing it to elevated temperatures. The temperatures that the dielectric material may be exposed may range from about 20° C. to about 430° C. Typically, the temperature may be from about 20° C. to about 385° C. More typically, the temperature is about 150° C. to about 350° C. Further typically, the temperature may be about 150° C. to about 250° C.

Figure 7:
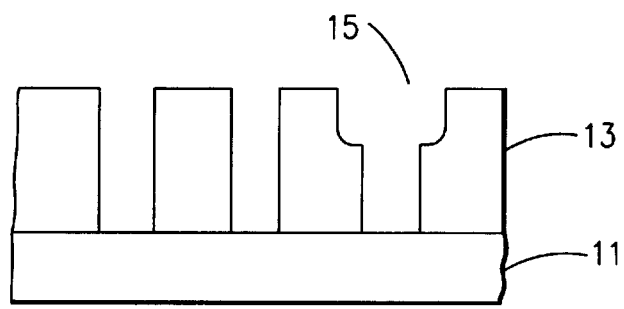
Figure 8:
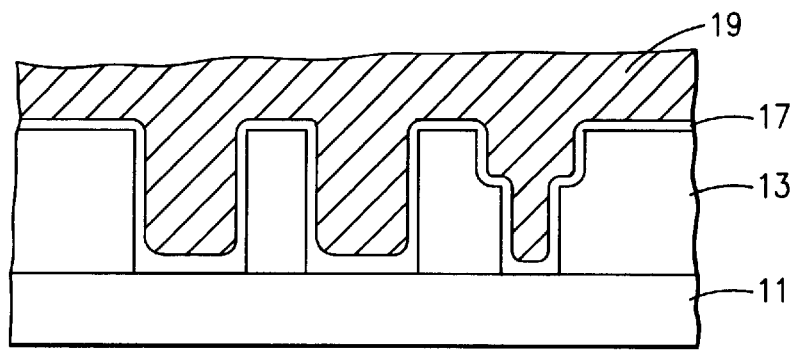

While exposing the dielectric material to elevated temperatures, the dielectric material may be exposed to reduced pressures. Along these lines, typically, dielectric material may be exposed to pressures of from about 2 millitorr to about 760 torr. The pressure may be even less than about 1 torr. FIG. 7 illustrates the structure illustrated in FIG. 6 after stabilization of the dielectric material.

A dielectric material may also be processed prior to patterning. Processing the dielectric material prior to patterning may include exposing it to elevated temperatures. Along these lines, prior to patterning, a dielectric material may be exposed to temperatures of about 20° C. to about 430° C. Typically, the temperature is from about 150° C. to about 250° C. The dielectric material may be exposed to these temperatures for a time of about from about one minute to about one hour. The exposure time could even be as long as several hours. During this period, the pressure that the dielectric material is exposed to typically is in the vicinity of atmospheric pressure.

After stabilizing the dielectric material, a barrier layer 17 may be deposited on the upper surface of the dielectric material 13, on a surface within the openings 15 and on the exposed surface of the underlying substrate 11 lying within the openings 15. Any barrier/adhesion layer may be utilized, depending upon the metal that is to be deposited in the patterned dielectric. Examples of barrier/adhesion layers include boron phosphorus doped silica glass (BPSG), phosphorus doped silica glass (PSG), silicon nitride, silicon carbide, diamond-like carbon, silicon oxynitride, and carbon-doped silicate glass(es). The thickness of the barrier/adhesion layer may also vary depending upon the environment. Typically, the barrier/adhesion layer has a thickness of about 200 Å to about 600 Å.

After depositing the adhesion layer, which may also act as a barrier layer, the metal 19 is deposited over the adhesion/barrier layer 17. Portions of the metal and the barrier/adhesion layer may be removed to result in the structure illustrated in FIG. 9. Removing the metal and barrier/adhesion layer may be carried out with traditional chemical mechanical polishing techniques or other techniques.

Figure 10:
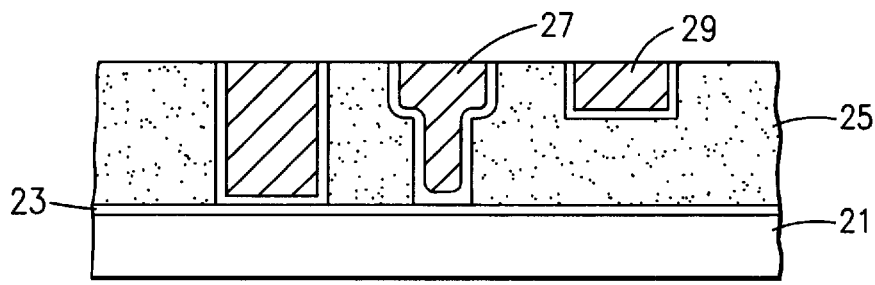
FIG. 10, FIG. 11, FIG. 12, FIG. 13, FIG. 14, FIG. 15, and FIG. 16 represent cross-sectional views of an embodiment of a structure at various stages during a second embodiment of a method according to the present invention.

FIG. 10 illustrates an example of an embodiment of a present invention wherein a dual damascene build structure has been created. The structure illustrated in FIG. 10 includes substrate 21 a barrier layer 23 of silicon dioxide $SiO_2$.

First dielectric material 25 has been deposited on layer 23, treated, if desired, and patterned. Adhesion/barrier layer 27 has been deposited and metal 29 deposited on the barrier/adhesion layer. The metal and portions of the barrier/adhesion layer have been polished off. The metal 29 may include any number of desired metals. According to one example, metal 29 may be a combination of TaN/Ta/Cu. According to another example, the metal is TiN/Al. According to further examples, the metal is Ta, TaN, Ti, TiN, W, WN, TiSiN, TaSiN, Ti/TiN/Al, Ti/TiN/W, Ti/W, and/or any typical metal interconnect fill of Cu, Al/Cu, W, and/or Au.

Figure 11:
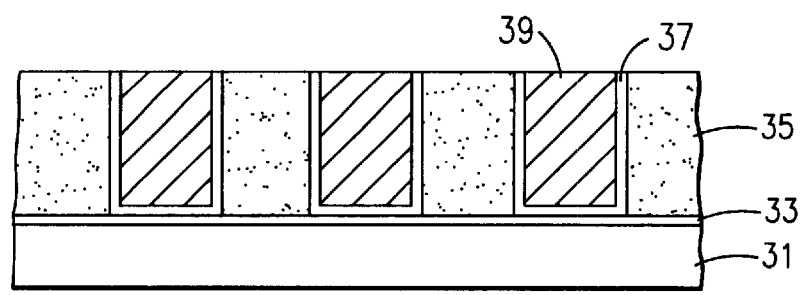

While FIG. 10 illustrates a dual damascene build structure, FIG. 11 illustrates a single damascene build. Accordingly, FIG. 11 illustrates substrate 31 with layer 33 formed thereon. Insulating material 35 has been deposited on layer 33 and patterned. Adhesion/barrier layer 37 has been deposited and beveled and deposited on barrier adhesion layer 37. The metal and adhesion/barrier layer have been polished to result in the structure illustrated in FIG. 11.

According to some embodiments, to protect the metal deposited in the patterned first dielectric layer, a cap may be formed over the metal. The cap may also extend over the barrier/adhesion layer. The composition of the cap may vary from embodiment to embodiment. A cap structure is particularly useful when the metal is copper.

The cap structure can prevent interdiffusion of metal between adjacent levels. Along these lines, the cap discussed herein can provide the functions of Cu diffusion barrier, Cu corrosion protection, and adhesion promotion of subsequent dielectrics to Cu. In a damascene interconnect, the barrier layer metal, Ta, TaN, TiN, among others, may protect the sides and bottom. However, after chemical mechanical polishing (CMP) planarization, the upper surface of the interconnect can be exposed. In the case of copper, all surfaces typically are protected from corrosion, as well as being treated for adhesion of subsequent films.

Alternatively, if the cap is selectively deposited, or otherwise patterned, such that the cap only exists on top of the copper interconnects, then the cap may be at least one metal. Such selective processes that have been considered include selective chemical vapor deposition of W, Al, or other corrosion-resistant metal, or electroless plating deposition of CoP, NiP, COWP, Sn, In, or other metal that can be selectively electrolessly deposited on Cu.

If the cap is a blanket film covering both the copper interconnect surfaces and the insulating gaps between the interconnects, then this cap typically is an insulator. Otherwise, the interconnects would be shorted together. The most commonly used thin film cap for this purpose is silicon nitride. Other possibilities for cap materials include silicon oxynitride, silicon carbide, and certain carbon-doped silicate glasses.

According to some embodiments, the cap may comprise CoP, NiP, Ni, or CoP/NiP or other suitable materials that provide similar characteristics and/or function with respect to properties important to the cap structure. The cap may help protect the metal during etch of the first dielectric, or insulating, material. Although they may be utilized with any embodiment, typically, the cap structures are necessary only when utilizing copper as the metal. This is because copper readily diffuses, whereas Al and W are more resistant to diffusion. Along these lines, Al(Cu) or Al can form a self-passivating, hard, stable oxide skin that protects it from corrosion and promotes adhesion to other materials. On the other hand, W doe not oxidize or corrode extensively enough to require a cap. Au interconnects typically require a cap, but only to promote adhesion of subsequent insulators, since Au does not corrode.

Cap structure 41 may be formed with any desired thickness. According to one example, the cap is about 1500 Å thick, for submicron interconnects, the cap may be thinner. Along these lines, the cap can have a thickness of about 200 Å to about 400 Å.

A cap that includes CoP/NiP may include about 500 Å of CoP and about 1000 Å of NiP. Typically, a layer of only one of these materials is used, although a layer including both materials may be used or two separate layers, one of each material. According to one embodiment, the cap includes two separate layers, one of CoP having a thickness of about 500 Å and one of NiP having a thickness of about 1000 Å. According to another specific embodiment, the cap includes a layer about 200 Å thick of CoP or COWP and a second layer having a thickness of about 0 Å to about 200 Å of NiP.

Figure 12:
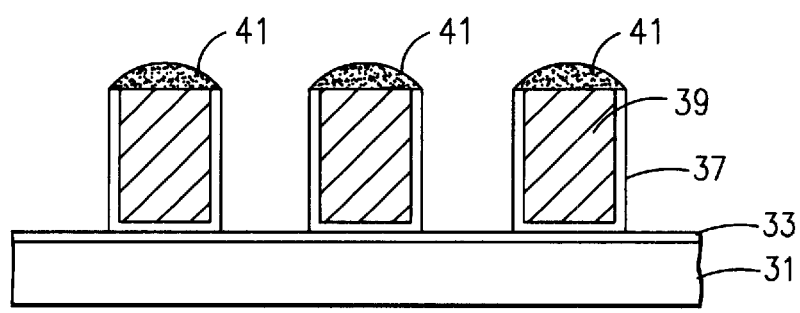

FIG. 12 illustrates an example of an embodiment of metal structure according to the present invention over which a cap 41 has been formed. In the structure illustrated in FIG. 12, the first dielectric material has also been removed. The substrate and metal illustrated in FIG. 12 correspond to the embodiment illustrated in FIG. 11.

After formation of a cap, if desired, and removal of the first, sacrificial dielectric, a second dielectric material may be provided in place of the first dielectric material. Any desired dielectric may be deposited in place of the first dielectric material. However, it is particularly desirable utilize the present invention for deposition for the spun-on dielectric materials discussed above in place of the sacrificial dielectric material. This is because the spun-on dielectric may be deposited at this point in the manufacture of a device not be subjected to the processes that it would have been subjected to during dielectric patterning and metal deposition that can result in damage to the spun-on dielectric materials. However, any dielectric material may be deposited in place of the sacrificial dielectric utilizing any method to deposit the second dielectric.

Figure 13:
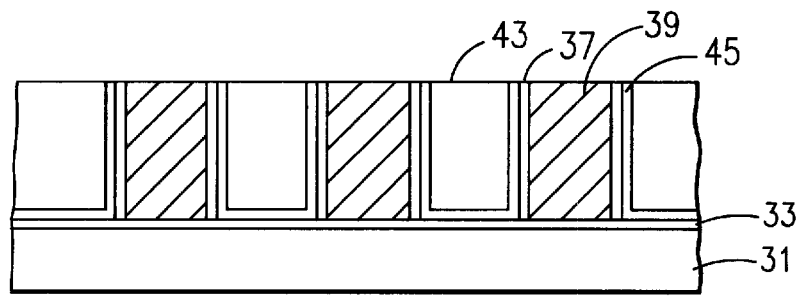

After depositing the second dielectric material, the cap may be removed from on top of the metal structures. FIG. 13 illustrates the structure illustrated in FIG. 12 after deposition of the second dielectric material 43 and removal of the cap structures 41 illustrated in FIG. 12. Prior to deposition of the second dielectric, another barrier/adhesion layer may be deposited over exposed portions of the substrate or layer 33 on top of the substrate and on exposed portions of the barrier/adhesion layer on the metal structures. The barrier/adhesion layer may be BPSG or any other suitable material.

The sacrificial dielectric/insulator may be removed according to any known process. For example, if the sacrificial dielectric is a polymer, etching or solvent removal techniques may be utilized. According to one example, a reactive ion etch is utilized. Along these lines, a reactive ion etch utilizing $O_2$ may be utilized. On the other hand, if the sacrificial dielectric is an oxide, an etch utilizing $CF_4$ plasma may be utilized to remove the sacrificial dielectric.

Figure 14:
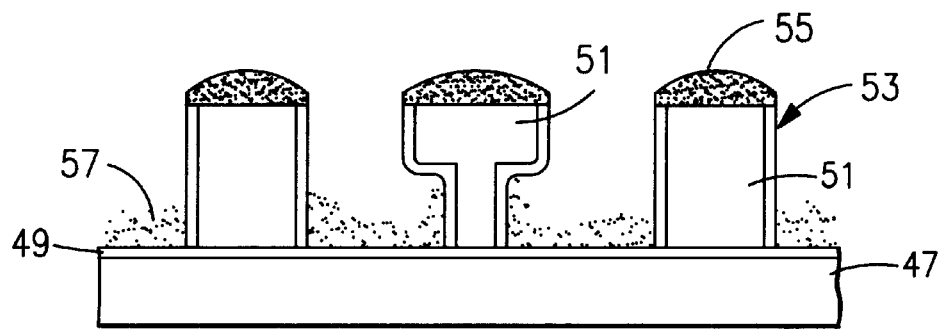

According to some embodiments, the sacrificial dielectric may not be entirely removed. According to such embodiments, a residue of the first, sacrificial dielectric may remain after removal of the first sacrificial dielectric. FIG. 14 illustrates an example of such an embodiment.

The structure illustrated in FIG. 14 includes substrate 47. Layer 49 has been deposited on substrate 47. Metal structures 51 have been formed on the layer 49, with a barrier/adhesion layer 53 intact on the metal structures 51. A cap structure 55 has been formed over the metal structures.

At the stage illustrated in FIG. 14, the first sacrificial dielectric layer has been removed. However, as stated above, portions 57 of the first dielectric layer remain on the structure. Not removing all of the sacrificial dielectric layer may help to stabilize and support very long poorly supported metal structures. In other words, metal structures that extend a long distance from the substrate.

Figure 15:
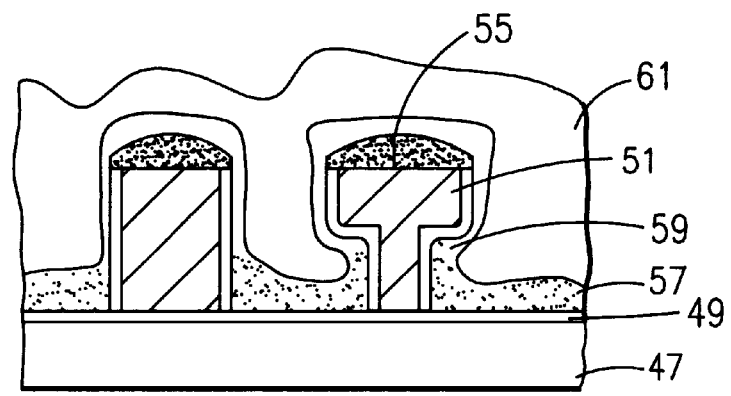

If the barrier layer deposited prior to metal deposition is totally or partially intact, another barrier layer may be deposited to replace the lost barrier/adhesion layer. One example of a material that may be utilized in the replacement barrier/adhesion layer is BPSG as discussed above. FIG. 15 illustrates a structure that includes a replacement barrier 59.

Figure 16:
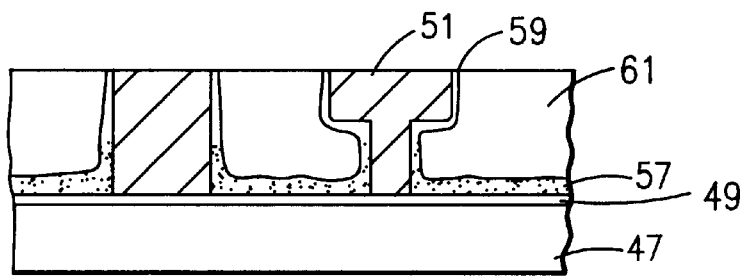

The structure illustrated in FIG. 15 represents a cross-sectional view of a portion of the structure illustrated in FIG. 14. Along these lines, the structure illustrated in 15 includes substrate 47, layer 49 deposited on substrate 47, residual sacrificial dielectric material 57, metal structures 51, and cap 55. A second dielectric material 61 has been deposited over the entire structure illustrated in FIG. 15. After depositing second dielectric 61, portions of the second dielectric layer, replacement barrier/adhesion layer, cap 55, and metal structures 51 may be removed in the entire upper surface of the surface planarized. The resulting structure is illustrated in FIG. 16.

Figure 9:
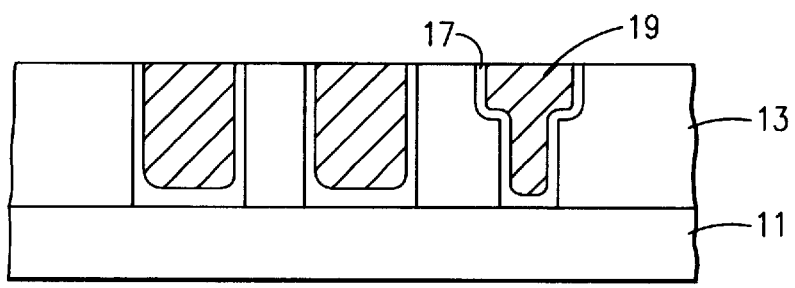

The present invention may be utilized to create multi-level metal structures. The sequence of steps for creating multi-level metal structures may vary, depending upon the embodiment. For example, according to one embodiment of the present invention for creating multi-level structures, prior to removing the first dielectric layer, an additional dielectric layer may be deposited over a structure such as that is illustrated in FIG. 9, the additional dielectric layer may be patterned, metal deposited and the metal planarized. This series of steps may be carried out as many times as is necessary to create as many metal levels as desired. According to one embodiment, the steps are repeated twice to result in a structure having three metal levels.

According to an alternative method, the first dielectric layer may be removed and the second dielectric material deposited to complete the first metal level. The steps for forming a structure illustrated in FIG. 9 may then be repeated on the second dielectric layer and first metal level. The sacrificial dielectric layer may be removed from the second metal level layer and the second dielectric layer deposited in the second metal level.

Alternatively, rather than moving the first dielectric material from the second metal level layer, a third layer may be built on top of the second level. According to this alternative embodiment, the first dielectric material may be removed from the second and third dielectric levels simultaneously. The second dielectric material may then be deposited therein.

According to one embodiment, three metal levels are formed prior to removing any of the first sacrificial dielectric material. The first dielectric material is removed from all metal levels. The second dielectric material may then be deposited in all three metal levels simultaneously. FIGS. 17–20 illustrate such an embodiment.

Figure 17:
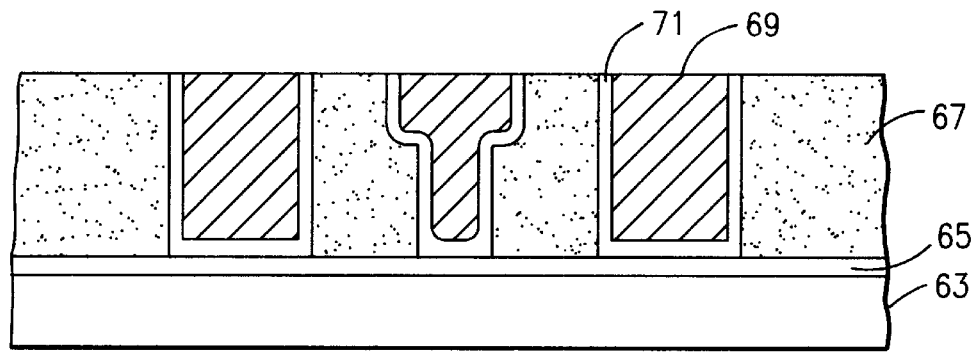
FIG. 17, FIG. 18, FIG. 19, and FIG. 20 represent cross-sectional views of an embodiment of a structure at various stages according to another embodiment of a process according to the present invention.

Along these lines, FIG. 17 illustrates a substrate 63. Layer 65 has been deposited on substrate 63. Sacrificial insulator layer 67 has been deposited on layer 65. Metal structures 69 have been provided in patterned openings in the first dielectric layer 67 with a barrier layer 71 deposited between the metal 69 and the insulator 67.

Figure 18:
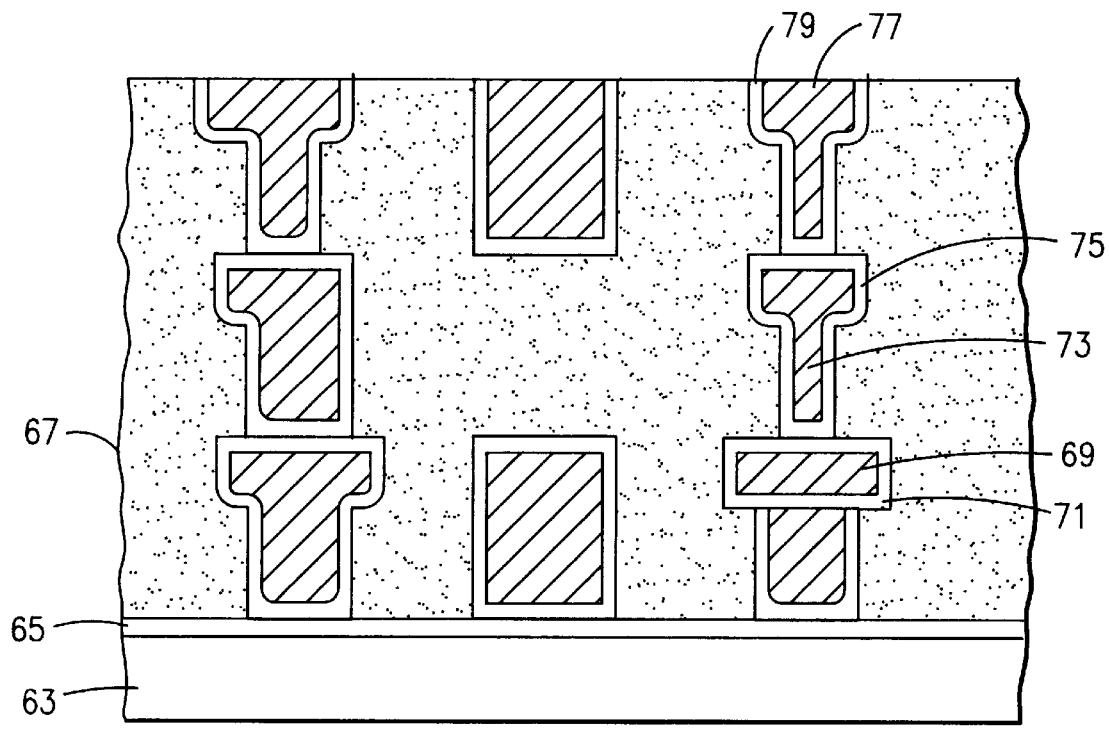

FIG. 18 illustrates the structure after two additional metal levels have been formed on the first level illustrated in FIG. 17. The second metal level illustrated in FIG. 18 includes metal structure 73 surrounded by barrier layer 75, while the third metal level illustrated in FIG. 18 includes metal structure 77 surrounded by barrier layer 79. Each metal level in the structure illustrated in FIG. 18 includes the same first dielectric material 67. However, in some embodiments various layers, even if they are built successively upon each other such as in the structure illustrated in FIG. 18, may include different dielectric materials as the first dielectric material.

Figure 19:
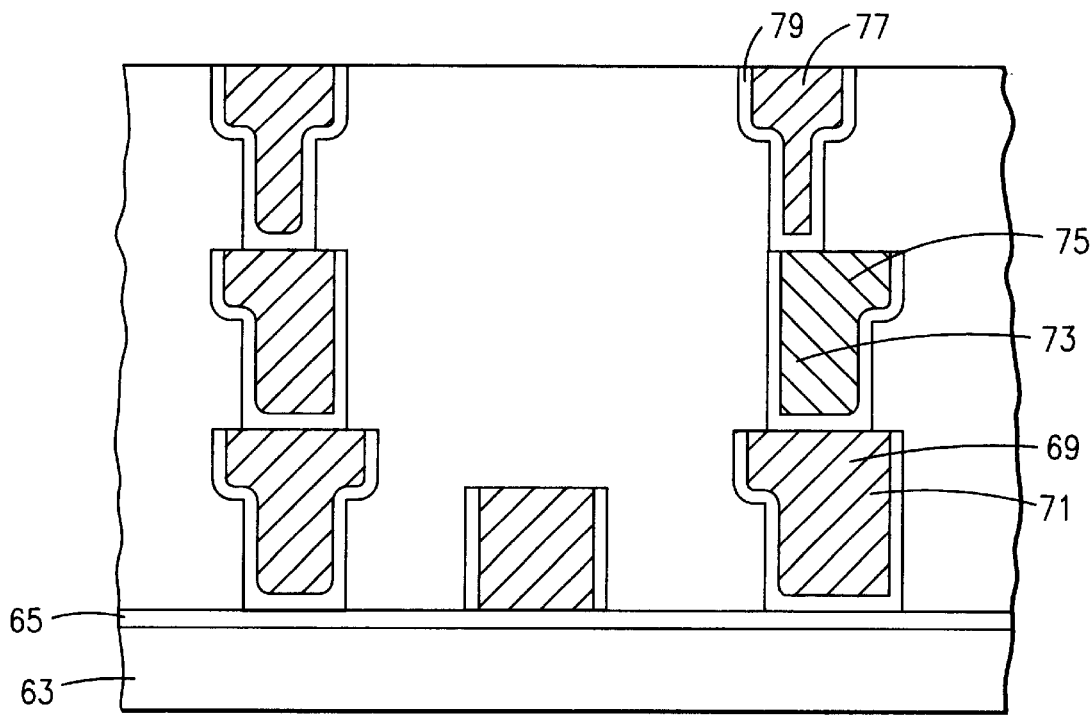

After forming the metal levels, all of the sacrificial dielectric may be removed, resulting in the structure illustrated in FIG. 19. Depending upon whether it is desired to remove just the sacrificial dielectric or also the barrier layer, different processes may be utilized. For example, if it is desired to remove the dielectric and the barrier layer, the materials may be removed with an etch utilizing a $CF_4$ plasma. If only the dielectric is being removed, it may be removed utilizing only solvents. The barrier layer typically exists only on the side walls and bottom walls of the interconnects and vias.

Figure 20:
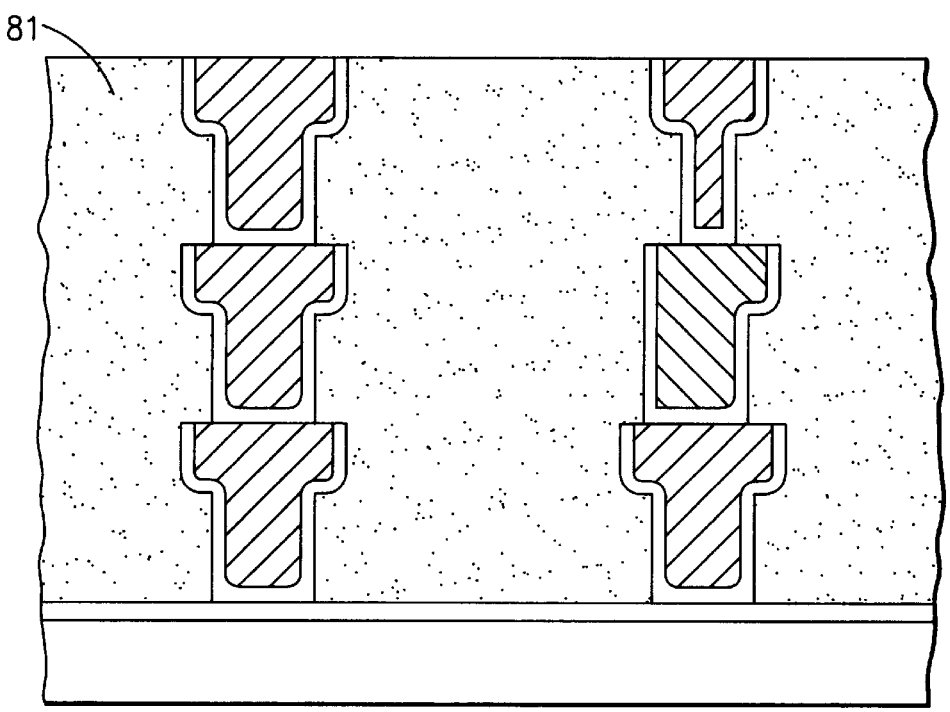

A second dielectric layer 81 may be then be deposited to result in the structure illustrated in FIG. 20. Whether it is the embodiment shown in FIG. 20, any other embodiment shown and described herein or any other embodiment, prior to depositing the second dielectric material, at least a portion of the surface of the at least one metal structure formed according to the present invention may be passivated.

Prior to deposition of the second dielectric material, if necessary, a barrier/adhesion layer may be deposited on all exposed surfaces to help facilitate retention of the second dielectric material. The barrier layer may be deposited according to variety of processes. For example, immersion coating may be utilized or electro deposition. According to other embodiments, a spin-off process may be utilized to deposit the barrier/adhesion layer.

The second dielectric may then be deposited. The second dielectric layer could be any spin-on dielectric as well as other dielectrics. Examples of materials that may be utilized as a second dielectric include FOX, SILK, Nanoglass, Xerogel, epoxides, porous silica, parylene, among others.

After deposition of the second dielectric layer, the second dielectric may be cured by exposing it to elevated temperatures. The temperature may be any temperature above room temperature. However, the temperature typically is about 145° C. to about 350° C. Also, the exposure may be carried out for any suitable time.

Typically, the exposure to elevated temperatures may take place for a time of about 15 minutes to about 60 minutes. Exposure to elevated temperatures may take place at atmospheric pressure. Alternatively, the subatmospheric or superatmospheric temperatures may be utilized. The exposure to elevated temperatures may take place in ambient atmosphere. Alternatively, the atmosphere may include other gasses. For example, the exposure to elevated temperatures typically is carried out in an atmosphere that includes forming gas, $N_2$, $H_2$, and/or ambient.

The curing of the second dielectric material may include exposing the second dielectric layer to a vacuum. Vacuum curing the second dielectric to electro deposition can minimize stress in the second dielectric material.

According to one example, the process includes a pre-cure stabilization/solvent drive off step of about 1 hour at about 250° C., followed by a full cure at about 400° C. for about 1 hour. Both of these process steps could be carried out in an inert or reducing atmosphere, such as $N_2$, or forming gas, respectively, at atmospheric pressure. The actual process utilized may depend upon the dielectric material involved and the manufacturers recommendations.

The second insulator/dielectric may then be polished to remove the upper portions and planarize the upper surface of the structure.

While the first and second dielectric materials typically are different, this is not a requirement of the present invention. In fact, the first dielectric and the second dielectric may be the same. In such cases, removing the first deposited dielectric and redeposited it may help to remove portions that were damaged during metal deposition.

Whether they are the same or whether they are different, the first and second dielectric materials may have a low dielectric constant. Typically, at least the second dielectric material has a low dielectric constant. According to some embodiments, the dielectric constant of the second dielectric material may be no greater than about 3.

The present invention also provides a metal structure formed according to the method described above.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

We claim:

1. A method for forming a structure, the method comprising:
   a) depositing a first dielectric material on a substrate;
   b) patterning the first dielectric material;
   c) depositing at least one metal in openings in the patterned first dielectric and on the patterned first dielectric material;
   d) removing portions of the at least one metal at least in a region above an upper surface of the first dielectric material;
   e) removing the first dielectric material;
   f) providing a second dielectric material in place of the first dielectric material; and
   g) depositing a barier/adhesion layer prior to depositing the at least one metal, wherein the barrier/adhesion layer comprises at least one of PSG and BPSG.

2. The method according 1, further comprising:
   repeating steps a–f at least once to form a multi-layer metal structure.

3. The method according to claim 1, further comprising:
   repeating steps a–d at least once prior to removing the first dielectric material; and
   carrying out steps e and f.

4. The method according to claim 3, further comprising:
   repeating steps a–f at least once after carrying out step f.

5. The method according to claim 3, further comprising:
   repeating steps a–d a plurality of times after carrying out step f; and
   again carrying out steps e and f.

6. The method according to claim 1, wherein both the first dielectric material and the second dielectric material are spun on.

7. The method according to claim 1, further comprising:
   vacuum baking the first dielectric material prior to depositing the at least one metal.

8. The method according to claim 1, further comprising:
   providing a layer of material on at least a portion of a surface of the at least one metal prior to providing the second dielectric material in order to passivate the at least a portion of the surface.

9. The method according to claim 1, further comprising:
   curing the second dielectric material.

10. The method according to claim 9, wherein the curing comprises exposure to a temperature of about 350° C. to about 415° C. for about 15 minutes to about 60 minutes, in an atmosphere that includes at least one of forming gas, $N_2$, $H_2$, or ambient air.

11. The method according to claim 1, wherein the first dielectric material is different than the second dielectric material.

12. The method according to claim 1, wherein the at least one metal is selected from the group consisting of copper, aluminum, tantalum, titanium, TaN/Ta/Cu, TiN/Al, Ti/TiN/Al, Ti/TiN/W and Ti/W.

13. The method according to claim 1, wherein the second dielectric material has a lower dielectric constant than a dielectric constant of the first dielectric material.

14. The method according to claim 12, wherein the second dielectric has a dielectric constant no greater than second dielectric has a dielectric constant no greater than about 3.

15. The method according to claim 1, further comprising:
   forming a cap on the at least one metal with an electroless deposition process.

16. The method according to claim 15, wherein the cap is formed after removing portions of the at least one metal.

17. The method according to claim 15, wherein the cap includes at least one material selected from the group consisting of Ni, CoP, NiP, and CoP/Nip.

18. The method according to claim 15, wherein the cap has a thickness of about 500 Å to about 1000 Å.

19. The method according to claim 1, wherein the first dielectric material is removed by at least one process selected from the group consisting of etching and dissolving in solvent.

20. The method according to claim 19, wherein the etching is a reactive ion etch or an etch utilizing $CF_4$ plasma.

21. The method according to claim 20, wherein the etch is a reactive ion etch utilizing $O_2$.

22. The method according to claim 1, further comprising:
   polishing the second dielectric material.

23. The method according to claim 1, wherein the first dielectric material includes at least one material selected from the group consisting of oxides and polymeric materials.

24. The method according to claim 23, wherein the polymeric materials comprise soluble epoxies.

25. The method according to claim 1, wherein the first dielectric material is a polymeric material and is removed by etching or by dissolving with a solvent.

26. The method according to claim 1, wherein the first dielectric material is an oxide and is removed by etching with $CF_4$ plasma.

27. The method according to claim 1, wherein the barrier/adhesion layer is deposited with a thickness of about 200 Å to about 600 Å.

28. The method according to claim 1, wherein the second dielectric material includes at least one material selected from the group consisting of FOX, SILK, nanoglass, xerogel, epoxies, porous silica, and parylene.

29. The method according to claim 1, wherein not all of the first dielectric material is removed prior to providing the second dielectric material.

30. The method according to claim 1, further comprising the step of stabilizing by heating the first patterned dielectric prior to depositing the at least one metal.

31. The method according to claim 30, wherein the stabilizing comprises exposing the first patterned dielectric to temperatures above ambient temperature.

32. The method according to claim 31, wherein the temperature is above about 20° C. and up to about 385° C.

33. The method according to claim 31, wherein the exposure to temperatures above ambient is carried out for about 1 minute to about 1 hour.

34. The method according to claim 31, wherein the stabilizing further comprises exposing the first patterned dielectric to pressure below standard pressure.

35. The method according to claim 34, wherein the pressure is above about 2 millitorr and below about 760 torr.

* * * * *